United States Patent [19]

Ray et al.

[11] Patent Number: 4,875,581

[45] Date of Patent: Oct. 24, 1989

[54] STATIC DISSIPATIVE ELASTOMERIC COATING FOR ELECTRONIC PACKAGING COMPONENTS

[75] Inventors: Robert Ray, Auburn, Me.; Robert A. Neal, R.F.D. 1, Wales Rd., Sabattus, Me. 04280; John R. Jaran, Waterbury; Tim Parker, Southbury, both of Conn.

[73] Assignees: Robert B. Ray; Robert A. Neal, both of Green, Me.

[21] Appl. No.: 713,420

[22] Filed: Mar. 19, 1985

[51] Int. Cl.$^4$ .............................................. B61D 73/02
[52] U.S. Cl. ................................... 206/328; 524/910; 428/922
[58] Field of Search ........................ 206/328; 524/910; 428/922

[56] References Cited

U.S. PATENT DOCUMENTS

| | | | |
|---|---|---|---|
| 4,154,344 | 5/1979 | Yenni et al. | 206/328 |
| 4,160,503 | 7/1979 | Ohlbach | 206/328 |
| 4,211,324 | 7/1980 | Ohlbach | 206/328 |
| 4,238,030 | 12/1980 | Maylandt | 206/328 |
| 4,241,829 | 12/1980 | Hardy | 206/328 |
| 4,293,070 | 10/1981 | Ohlbach | 206/328 |
| 4,424,900 | 1/1984 | Petcavich | 206/328 |
| 4,480,747 | 11/1984 | Kazor et al. | 206/328 |
| 4,482,048 | 11/1984 | Blodgett | 206/328 |
| 4,496,406 | 1/1985 | Dedon | 206/328 |

Primary Examiner—Joseph Man-Fu Moy
Attorney, Agent, or Firm—Auslander & Thomas

[57] ABSTRACT

The invention features a static dissipative elastomeric outer coating for an electronic package composite. The coating is characterized by its superior abrasion resistant and electrical properties. The coating chemically bonds with the conductive layer and has superior static dissipative qualities characterized by a surface resistivity in the range of between $10^5$ and $10^{11}$ ohms per square.

4 Claims, 1 Drawing Sheet

STATIC DISSIPATIVE ELASTOMERIC COATING FOR ELECTRONIC PACKAGING COMPONENTS

FIELD OF INVENTION

The invention relates to electronic packaging materials and composites, and more particularly to a novel static dissipative coating for an electronic packaging composite.

BACKGROUND OF THE INVENTION

In recent times, a sizable industry has developed for the packaging of electronic components, such as microelectronic chips and integrated circuits. Such packaging has as one of its objectives to prevent electrostatic discharge from damaging or destroying these components. The envelopes or bags in commercial use are known as anti-static packages, which generally consist of:

1. An inner layer or ply of an anti-static polyethylene of between 1 to 4 mils thickness, that has a surface resistivity of between $10^8$–$10^{13}$ ohms per square to minimize triboelectric charge build-up and avoid electrical damage.

2. A dielectric or non-conductive layer may be adhered to the anti-static layer to provide electrical insulation, over which a conductive or metallized layer of aluminum or nickel is applied. The metal provides a conductive ground plane, and is applied in a very thin layer, usually by vacuum deposition, between 1 and 150 angstroms thick, in order to provide partial transparency.

In order to protect the thin metallized layer, an abrasion-resistant layer is applied over the thin metal layer.

In one approach, a resinous material is used for this abrasion layer, which is applied in ultra-thin thickness of about 0.15 micrometers. Such a coating is taught in U.S. Pat. Nos. 3,118,781 and 4,154,344. The resinous coating comprises a copolyester of equal parts terephthalic acid and isophthalic acid with ethylene glycol, which is applied from a solution of cyclohexanone at a solids concentration of 1.5 percent by weight.

Such a coating, while claiming to be an abrasion resistant layer, in practice has been known to "crumb off" with the metallized conductive layer and which could contaminate components and clean rooms. In addition, this layer has a surface resistivity of less than $5 \times 10^4$ ohms per square. Because of this low resistivity, this layer will bleed off to the conductive layer, discharging current at a high rate. This has the potential to produce arcing through the dielectric shield to "protected" components, and is a shock hazard to personnel.

In another approach, as taught in U.S. Pat. No. 4,424,900, the abrasion-resistant coating is an insulating layer of polyester of about 0.5 to 2.0 mils thick. The volume resistivity of $10^{10}$ ohms per centimeter for this layer translates to a minimum surface resistivity of $10^{13}$ ohms per square.

This approach will not dissipate electrostatic charges and therefore does not provide protection against high voltage exposure of about 12 KVA, and is likely to short out by arcing.

By contrast, the coating of this invention has a demonstrated ability to withstand multiple repetitive charges without capacitive storage. Application of voltage of 12 KVA is sustained for periods of up to 150 seconds. The electrical stability of this polymer not only provides a controlled rate of discharge, but maintains this protection over the functional life of the package (envelope).

BRIEF SUMMARY OF THE INVENTION

When applied over a conductive layer with a resistivity of less than 250 ohms per square, the coating of this invention comprises an outer, tough, thin, elastomeric layer having a surface resistivity in the range of between $10^5$ to $10^{11}$ ohms per square, which characterizes this material as an excellent static dissipater.

Being elastomeric, this coating is further characterized by its flexibility, crease-resistance and abrasion-resistance, having a tensile modulus at 100 percent elongation under 2,000 pounds per square inch in a range of between 300 pounds per square inch to 2,000 pounds per square inch. The coating also provides a corrosion resistant barrier to water, chemicals and electronic cleaning solvents.

The inventive coating, can be applied thick, generally in a range from 0.4 to 4.8 grams per square meter, or 0.3 to 3.6 micrometers. The coating provides a gain over other coatings in abrasion resistance by an order of magnitude. When coated upon an aluminum conductor, its optical density of approximately 0.28 provides a 40 percent transmission of light, and excellent binding with the conductor. The coating provides excellent stress-/strain relief in bending, flexing and creasing.

The inventive coating can be used in an electronic packaging composite. The composite comprises an inner layer of antistatic material, a layer of a dielectric material adhered to the anti-static layer, and a conductive, transparent layer disposed over said dielectric layer, which is covered by the inventive coating.

The conductive layer as used in the composite can be aluminum having a maximum surface resistivity of no greater than 250 ohms per square, and preferably, a surface resistivity of less than 100 ohms per square.

BRIEF DESCRIPTION OF THE DRAWINGS

Although such novel feature or features believed to be characteristic of the invention are presented out in the claims, the invention and the manner in which it may be practiced, may be further understood by reference to the following description and the accompanying drawing.

DETAILED DESCRIPTION OF THE INVENTION

Referring now to the figures in greater detail, where like reference numbers denote like parts in the various figures.

Figure 1:
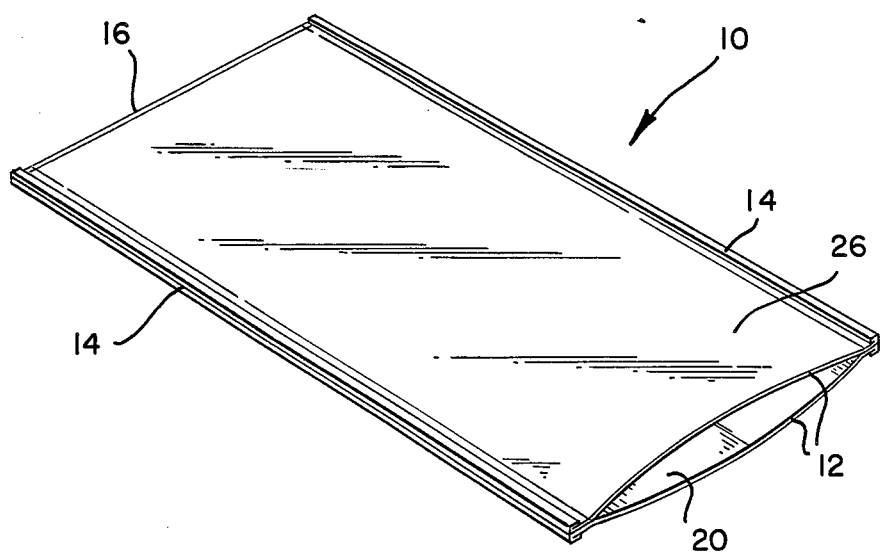
FIG. 1 is a perspective view of an electronic anti-static package utilizing the present outer, semi-conductive, elastomeric coating of this invention.

Referring to FIG. 1, an anti-static electronic package 10 is shown having a sheet 12 of composite material that is folded over at the bottom edge 16 and heat sealed along the sides 14 to form an envelope. The inner surface material 20 of the envelope comprises an anti-static, heat-sealable plastic, and the outer surface material 26 comprises the static dissipative coating of this invention.

Figure 2:
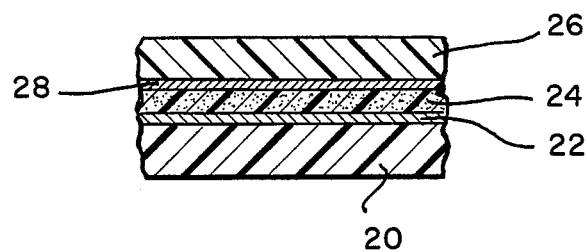
FIG. 2 is an enlarged sectional view of the sides of the package of FIG. 1, illustrating the various plies forming the sides.

Referring to FIG. 2, an enlarged sectional view of the sheet 12 of the composite is illustrated. The inner surface layer 20 is comprised of a heat-sealable anti-static ply, over which is layered an adhesive 22 to bind the dielectric layer 24 to the anti-static layer 20.

A thin, transparent metallic conductive layer 28 is applied over the dielectric layer 24. The conductive layer is generally between 1 and 150 angstroms thick, in order to provide partial transparency through the envelope.

The outer layer 26, comprising the coating of the invention, is applied to the conductive layer 28. The static dissipative elastomeric coating of this invention consists of a thermoset, elastomeric phenyl-acrylate which chemically couples with the conductive ground plane to achieve a Faraday cage effect when both surfaces of the envelope are folded from a single piece of laminate.

One of the unique features of the specific elastomeric polymer employed is demonstrated by a drop in optical density of the conductive layer from 0.45 to 0.28 after coating. The combination of surface wetting, mechanical reinforcement and the match of index of refraction of the coating and conductive layer permits use of higher conductive shield deposits for better ground plane efficiency without sacrificing visual or optical scanner identification of components contained in the envelope. The crosslinking provides a chemical barrier to protect both the envelope integrity and the components contained therein.

The semi-conductive nature of the formulation when applied over a conductive ground plane presents an opportunity to apply a relatively thick protective layer without losing dissipative ability. The thicker layer results in greater bend angles in handling and broader area applied load distribution. This is demonstrated in the following performance of a laminate consisting of an inner layer of 0.06 mm antistatic low density polyethylene laminated to an 0.02 mm polyethylene terephthalate polyester film with an 0.8 gram per square meter outer layer over the ground plane.

The coating of the invention provides a composite envelope having superior current injection, field attenuation and static decay characteristics.

This type of electrical protection to contained components is maintained despite mechanical simulation of worst case abuse prior to testing.

EXAMPLE 1

A coating of 5 to 50 percent solids by weight, (25 to 35 percent preferred) is prepared from an aromatic acrylate ester copolymer as supplied by Morton (Lucidene ®), Zinchem (Zinpol ®), S. C. Johnson (Joncryl ®) or Richardson Polymer Corporation of Madison, Conn., phenylated acrylate. The coating can be prepared by dissolving 30 percent by weight of the Richardson copolymer in 70 percent by weight, equal amounts of methyl ethyl ketone, tolune and cyclahexanone. The mixture is stirred until dissolved and then 10 parts per hundred of butyl benzyl phthalate is added. The coating mixture is then applied in a wet film thickness of approximately 8 microns to the metallized side of a continuous web by conventional means, which can include a roll, rod and air knife. The web is then died at a temperature in the range of 150° F. to 300° F. (66° C. to 149° C.) to evaporate the solvents and crosslink the coating at process speeds from 100 to 1,000 feet per minute. Surface resistivity can be adjusted with conductive additives. These additives can be of the surfactant type, such as, General Analine and Film's Gafac ® RD 610; conductive polymers, such as Nalco's 8674, or conductive fillers/metals, such as Cabot's Vulcan ® series blacks.

Elastomeric type acrylates, such as Dupont's Elvacite ® and Rohm and Haas, Acryloid ® can be employed in the same manner and processed as Example No. 1. Although the butyl ester copolymers or terpolymers are preferred for extensibility and adhesion, additional resiliency and abrasion resistance can be obtained through modification with compatible plasticizers, such as butyl benzyl phthalate.

EXAMPLE 3

Polyethylene terephthalate type polyesters, such as Goodyear's Vitel ® and Ashland's Pliobond ®, also have desirable adhesion, durability and dielectric stability attributes. The harder grades can be softened with amorphous polyesters, such as Goodyear's 5545 ® or Morton's 548 ®.

Other elastomers, such as polyurethanes, polyamides and silicones can be formulated to obtain this type of performance.

The composite shown in the figures can preferably comprise for the anti-static layer 20, a heat-sealable low density polyethylene of approximately 2.3 mils (0.06 mm) in thickness. This layer is laminated to a 92 gage (0.02 mm) PET polyester layer 24. The outer elastomeric layer 26 can be 0.8 grams per square meter over an aluminum conductive layer 28. The metal layer 28 in combination with the elastomeric layer 26 is preferred to have a minimum light transmission of 40 percent, wherein the resistivity of the metallized layer 28 is preferred to be less than 100 ohms per square and no greater than 250 ohms per square.

The composite can also vary by utilizing an anti-static layer of low density polyethelene from 1 to 4 mils (0.02 to 0.1 mm) thickness, having a surface resistivity of from $10^5$ to $10^{14}$ ohms per square and preferably $10^8$–$10^{13}$ ohms per square.

The dielectric layer 24 can vary in thickness from 0.5 mil to 2 mil (0.01 to 0.05 mm) with 92 gage preferred (0.02 mm).

The adhesive layer 22 can be eliminated by casting or coextruding the layers 20 and 24. A suitable adhesive 22 can also be used as taught in the art.

A Faraday cage effect is produced by the electronic package construction set forth above. This is aided by the chemical coupling of the semi-conductive elastomeric coating layer 26 to the conductive layer 28.

The above composite has demonstrated superior durability and abrasion resistance, while achieving improved electrical properties, as shown by current injection testing, charge retention testing, direct discharge testing, field attenuation testing and static decay testing (ASTM D-257).

The terms and expressions which are employed are used as terms of description; it is recognized, though, that various modifications are possible.

It is also understood the following claims are intended to cover all of the generic and specific features of the invention herein described; and all statements of the scope of the invention which as a matter of language, might fall therebetween.

Having described certain forms of the invention in some detail, what is claimed is:

1. An outer surface, static dissipative transparent elastomeric coating which is applied over a conductive, transparent layer of an electronic packaging composite, characterized by being static dissipative with a surface resistivity in a range between 8 to 10 ohms per square.

2. The outer surface, static dissipative, transparent elastomeric coating of claim 1, having a surface resistivity of approximately $10^9$ ohms per square.

3. The outer surface, static dissipative, transparent elastomeric coating of claim 1, further characterized as abrasion-resistant with a tensile modulus in a range of between 300 pounds per square inch to 2,000 pounds per square inch at 100 percent elongation.

4. The outer surface, static dissipative, transparent elastomeric coating of claim 1, comprising a phenylated, acrylic ester.

* * * * *

UNITED STATES PATENT AND TRADEMARK OFFICE
CERTIFICATE OF CORRECTION

PATENT NO. : 4,875,581
DATED : October 24, 1989
INVENTOR(S) : Robert Ray, Robert A. Neal, John R. Jaran and Tim Parker It is certified that error appears in the above-identified patent and that said Letters Patent is hereby corrected as shown below:

Column 5, line 2, insert and change "8 to 10 ohms" to -- $10^8$ to $10^{10}$ ohms --

Signed and Sealed this

Ninth Day of June, 1992

Attest:

DOUGLAS B. COMER

*Attesting Officer*  *Acting Commissioner of Patents and Trademarks*